US007224044B2

(12) United States Patent
Kawada et al.

(10) Patent No.: US 7,224,044 B2
(45) Date of Patent: May 29, 2007

(54) SEMICONDUCTOR CHIP MOUNTING SUBSTRATE AND FLAT DISPLAY

(75) Inventors: Toyoshi Kawada, Kawasaki (JP); Yuji Sano, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 10/331,918

(22) Filed: Dec. 31, 2002

(65) Prior Publication Data

US 2003/0141576 A1 Jul. 31, 2003

(30) Foreign Application Priority Data

Jan. 31, 2002 (JP) ............................ 2002-024492

(51) Int. Cl.
*H01L 23/495* (2006.01)

(52) U.S. Cl. ...................... 257/666; 257/668; 257/702; 257/704; 257/737; 257/784; 257/687

(58) Field of Classification Search ................ 257/666, 257/668, 701–704, 737, 784, 692, 687
See application file for complete search history.

(56) References Cited

U.S. PATENT DOCUMENTS

| | | | | |
|---|---|---|---|---|
| 4,523,371 | A | | 6/1985 | Wakashima |
| 5,525,839 | A | * | 6/1996 | Shu ............................ 257/780 |
| 5,572,070 | A | * | 11/1996 | Ross .......................... 257/713 |
| 5,646,439 | A | | 7/1997 | Kitayama et al. |

FOREIGN PATENT DOCUMENTS

| | | | | |
|---|---|---|---|---|
| CN | 1211073 | | | 3/1999 |
| EP | 0266210 | | | 5/1988 |
| EP | 0288186 | A | | 10/1988 |
| FR | 2795908 | | | 1/2001 |
| JP | 567453 | | | 1/1981 |
| JP | 3116941 | | | 5/1991 |
| JP | 07-302808 | | | 11/1995 |
| JP | 08-204048 | | | 8/1996 |
| JP | 10170380 | A | * | 6/1998 |
| JP | 10-199911 | | | 7/1998 |
| JP | 11-260969 | | | 9/1999 |
| JP | 2000-187239 | | | 7/2000 |
| JP | 12250425 | A | * | 9/2000 |

OTHER PUBLICATIONS

Patent Abstract of Japan of JP 05198603 dated Aug. 6, 1993.
Copy of Chinese Office Action for corresponding Chinese application No. 03101758.4.
European Search Report for Application No. EP03250116 dated Jun. 14, 2006.
Japanese Patent Office Action for corresponding Japanese Patent Application No. 2000-024492 dated Feb. 14, 2006.

* cited by examiner

*Primary Examiner*—Long Pham
(74) *Attorney, Agent, or Firm*—Staas & Halsey LLP

(57) ABSTRACT

A semiconductor chip mounting substrate having a semiconductor bare chip and a substrate electrically connected to the semiconductor bare chip by wire bonding is provided. Here, a protective film is provided on the surface of the semiconductor bare chip and is disposed so as to expose all or a part of a bonding wire.

22 Claims, 11 Drawing Sheets

F I G. 1A
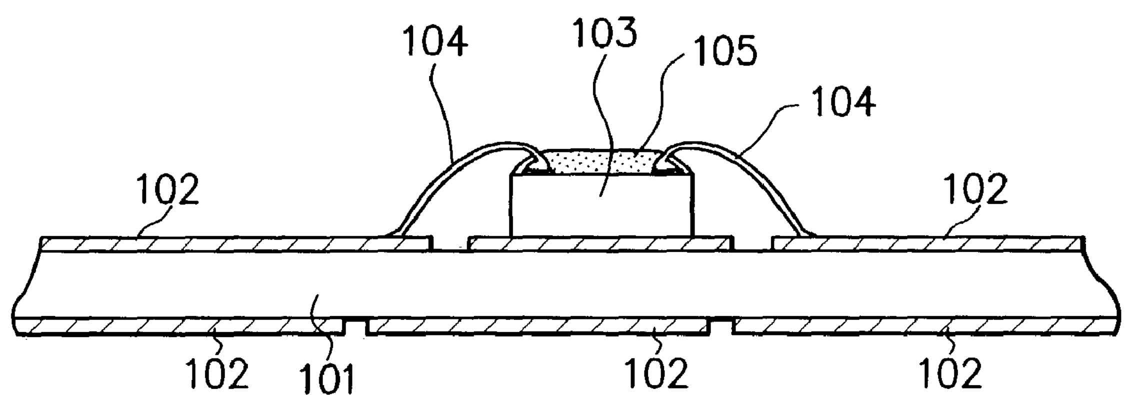
F I G. 1B
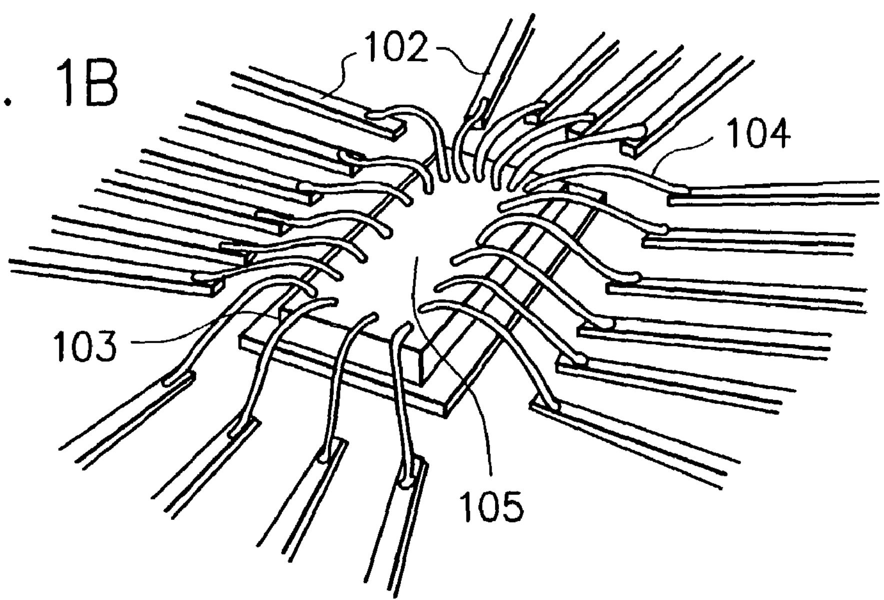

F I G. 4
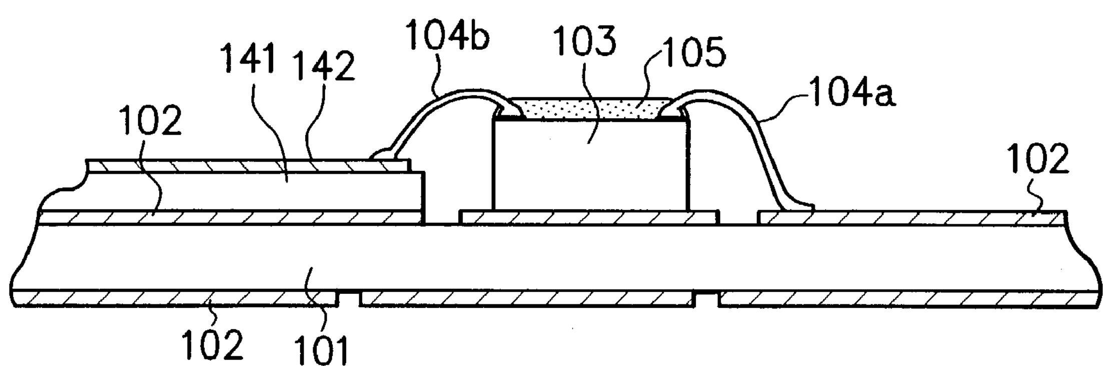
F I G. 5
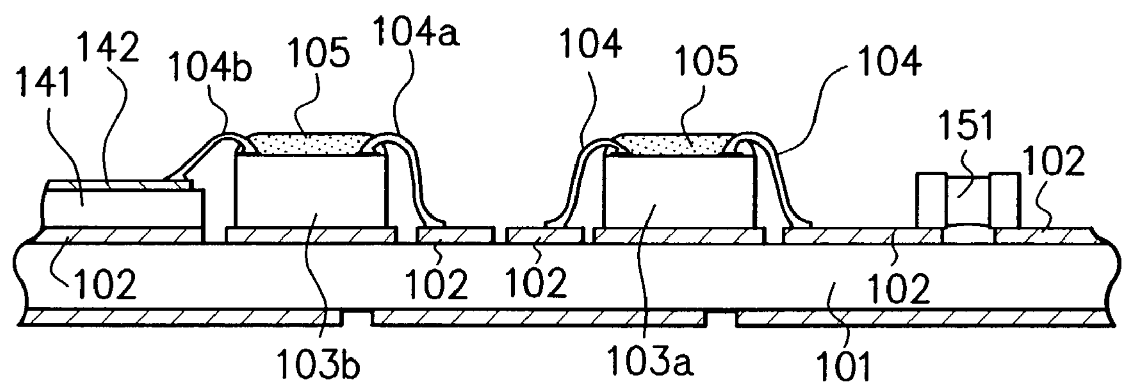

F I G. 6A
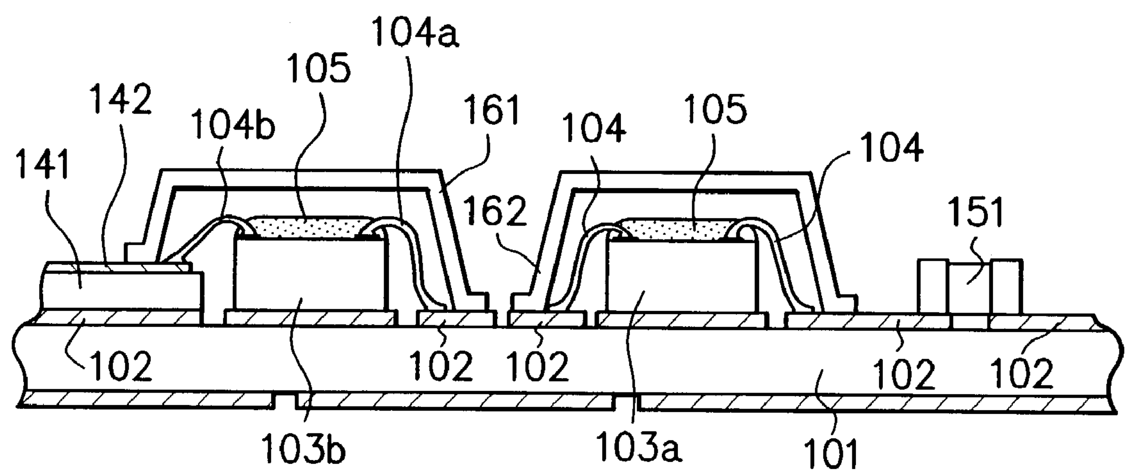
F I G. 6B
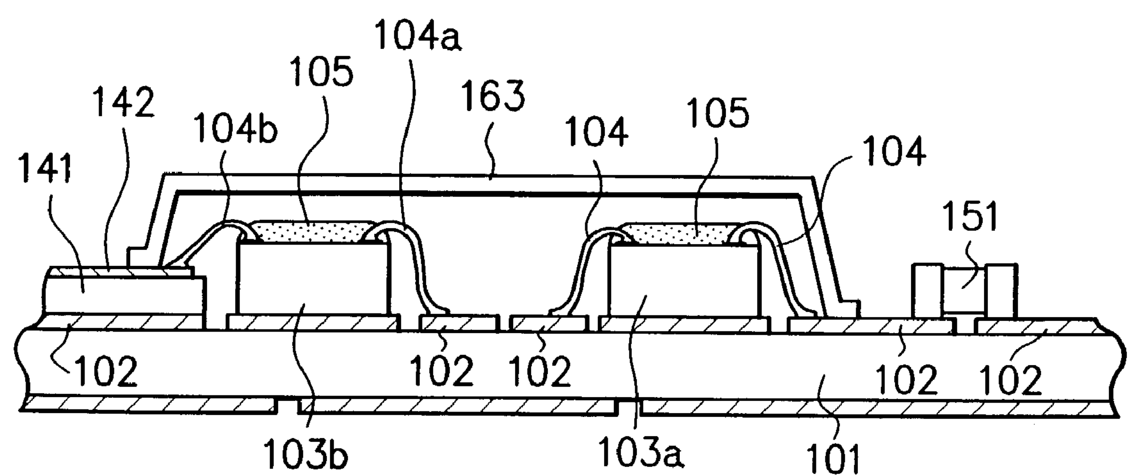

F I G. 7A
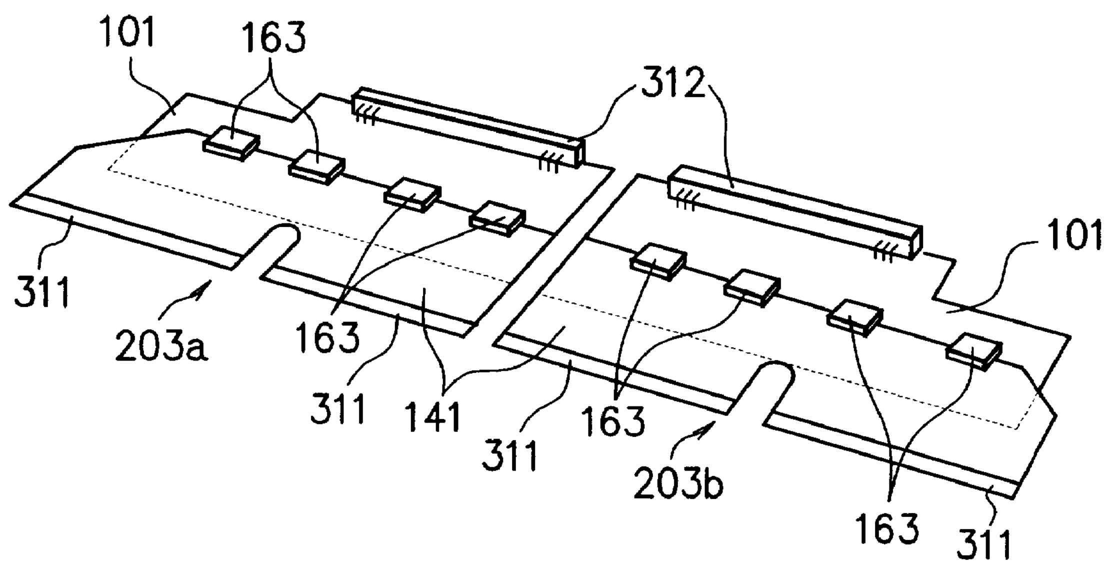
F I G. 7B
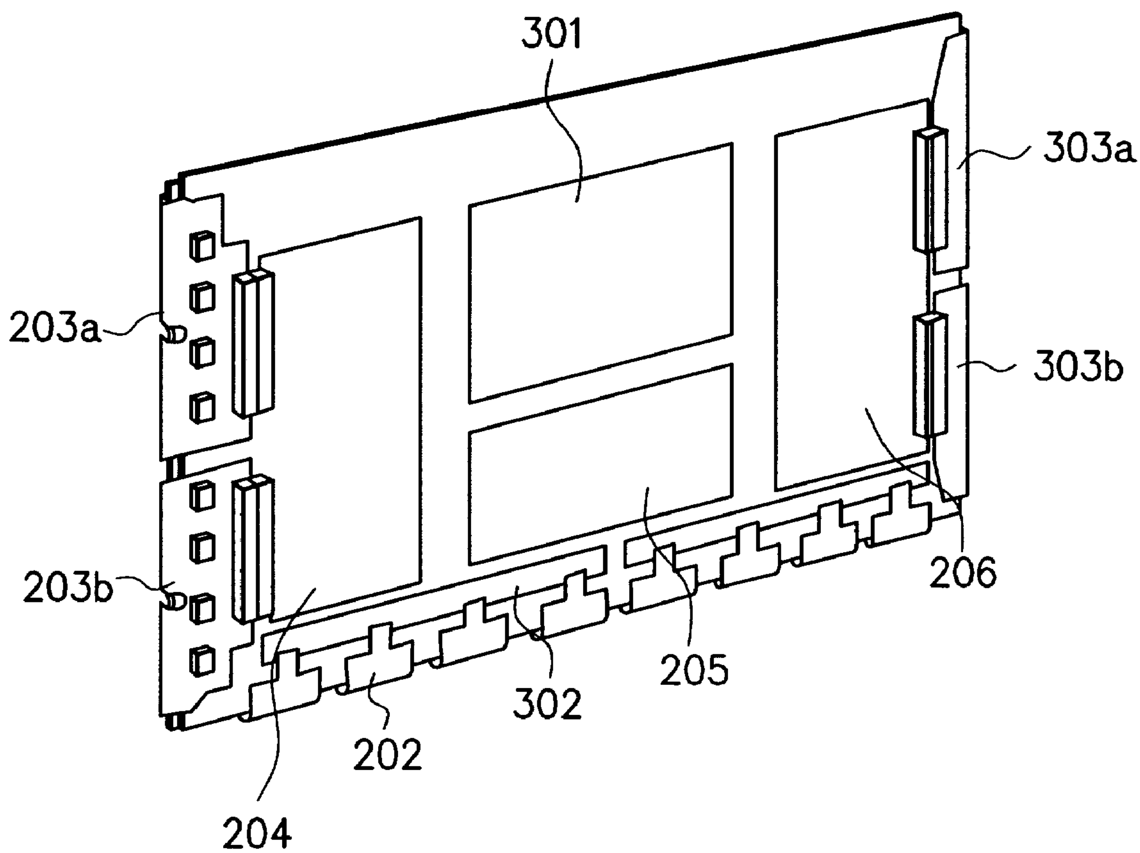

F I G. 8
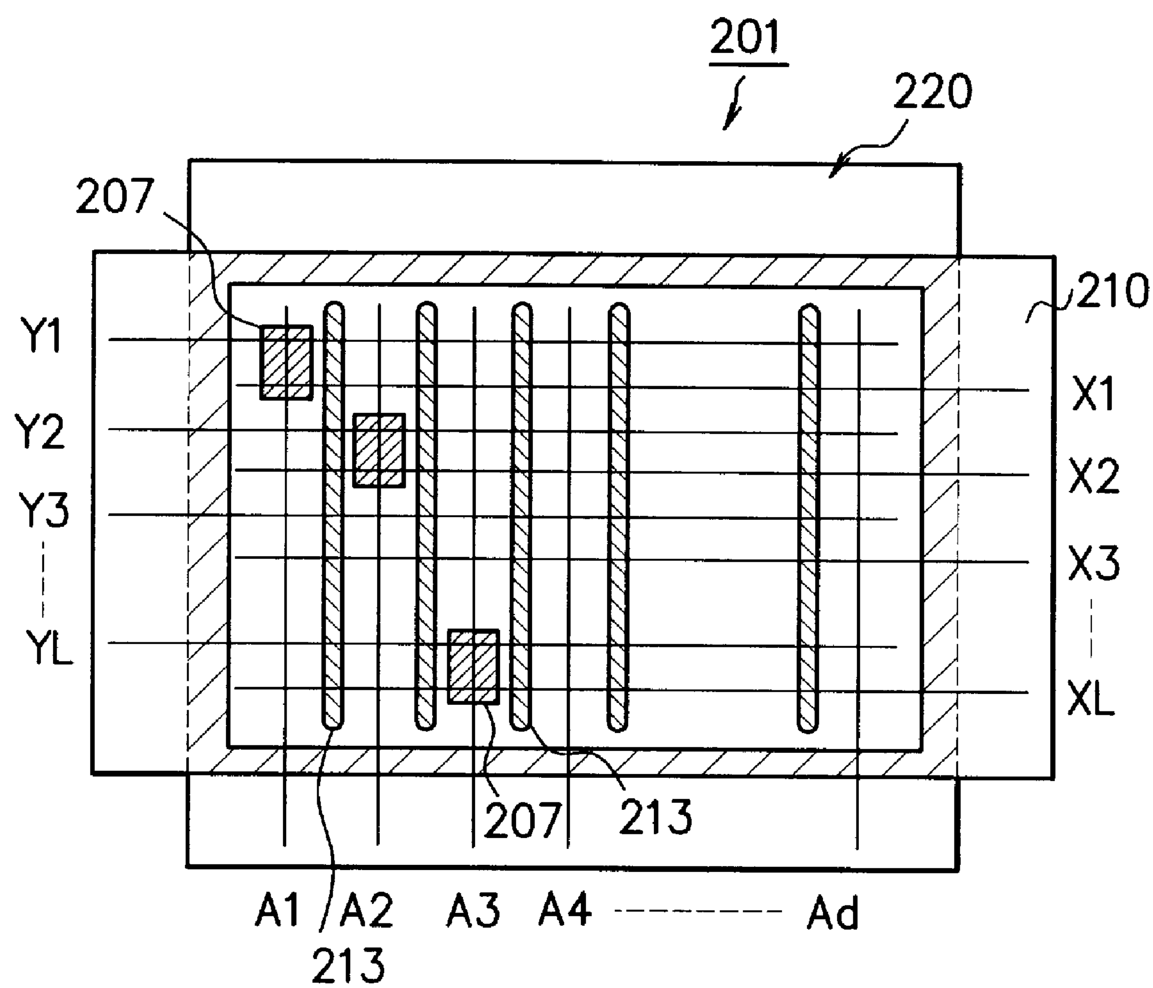

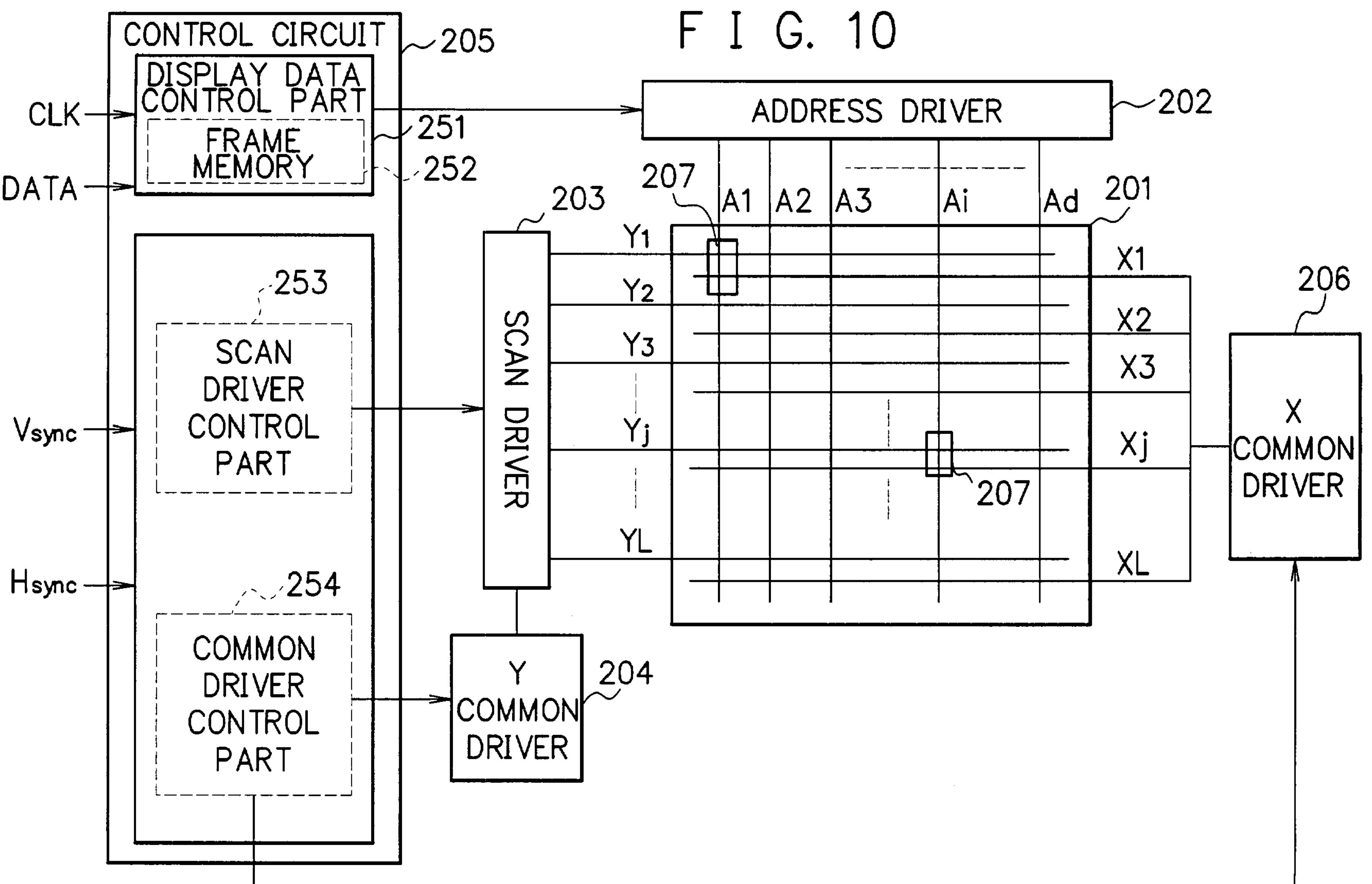
F I G. 10
CONTROL CIRCUIT
205
DISPLAY DATA CONTROL PART
FRAME MEMORY
251
252
CLK
DATA
Vsync
Hsync
253
SCAN DRIVER CONTROL PART
254
COMMON DRIVER CONTROL PART
ADDRESS DRIVER
202
203
SCAN DRIVER
207
A1
A2
A3
Ai
Ad
201
Y1
Y2
Y3
Yj
YL
X1
X2
X3
Xj
XL
207
206
X COMMON DRIVER
Y COMMON DRIVER
204

F I G. 11
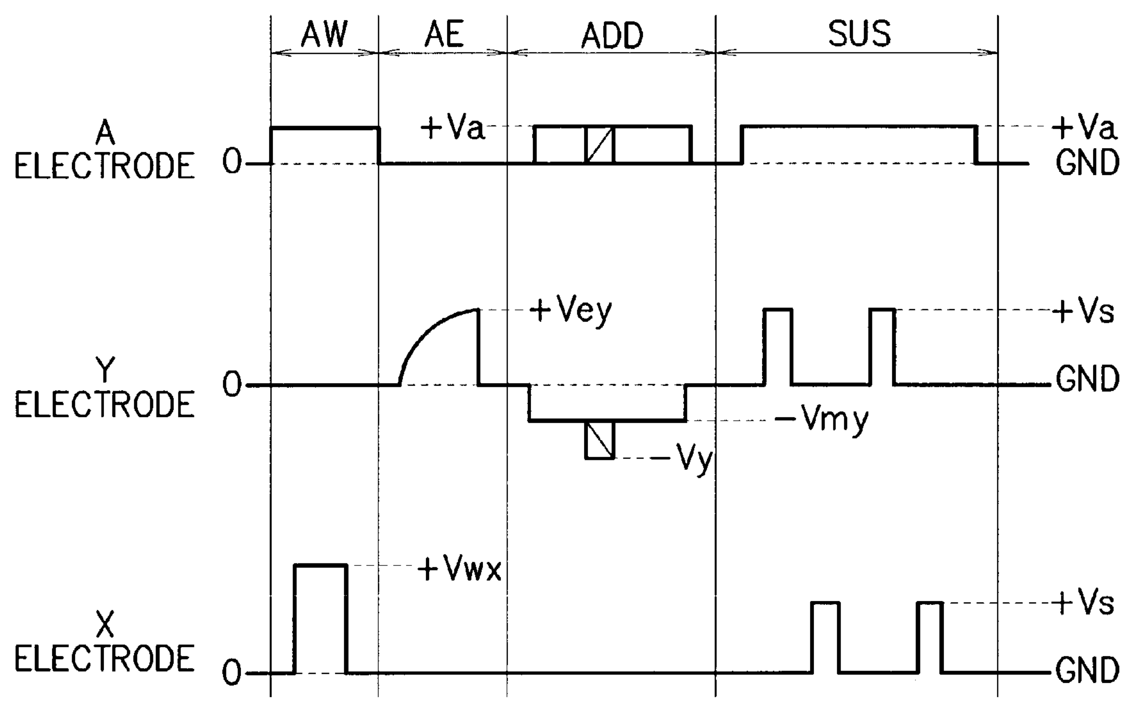

SEMICONDUCTOR CHIP MOUNTING SUBSTRATE AND FLAT DISPLAY

CROSS-REFERENCE TO RELATED APPLICATIONS

This application is based upon and claims priority of Japanese Patent Application No. 2002-024492, filed on Jan. 31, 2002, the contents being incorporated herein by reference.

BACKGROUND OF THE INVENTION

1. Field of the Invention

The present invention relates to a semiconductor chip mounting substrate, and more particularly, to the semiconductor chip mounting substrate in which a semiconductor bare chip is connected to a substrate by wire bonding.

2. Description of the Related Art

Recent years have seen a remarkable progress in the development of a display device using a flat display panel, and especially, a three-electrode surface-discharge AC flat display panel (PDP) is being put into practical use for and applied to a large-sized television set and so on since its screen can easily be made large and colorized.

FIG. 8 is a block diagram schematically showing a three-electrode surface-discharge plasma display panel of an AC drive type, and FIG. 9 is a cross sectional view explaining the electrode structure of the plasma display panel shown in FIG. 8. In FIG. 8 and FIG. 9, the reference numeral 207 denotes discharge cells (display cells), 210 a rear glass substrate, 211 and 221 dielectric layers, 212 phosphors, 213 barrier ribs, 214 address electrodes (A1 to Ad), 220 a front glass substrate, and 222 X electrodes (X1 to XL) or Y electrodes (Y1 to YL), respectively. Note that the reference symbol Ca shows capacity between adjacent electrodes in the address electrodes 214, and Cg shows capacity between opposing electrodes (the X electrode and the Y electrode) 222 in the address electrodes 214.

A plasma display panel 201 is composed of two glass substrates, the rear glass substrate 210 and the front glass substrate 220. In the front glass substrate 220, the X electrodes (X1, X2, to XL) and the Y electrodes (scan electrodes: Y1, Y2, to YL) constituted as sustain electrodes (including BUS electrodes and transparent electrodes) are disposed.

In the rear glass substrate 210, the address electrodes (A1, A2, to Ad) 214 are disposed to perpendicularly cross the sustain electrodes (the X electrodes and the Y electrodes) 222. Each of the display cells 207 generating discharge light-emission by these electrodes is formed in a region which is sandwiched by the X electrode and the Y electrode, namely the sustain electrodes, assigned the same number (Y1-X1, Y2-X2, . . . ) and which intersects the address electrode.

FIG. 10 is a block diagram showing the overall structure of a plasma display device using the plasma display panel shown in FIG. 8. It shows an essential part of a drive circuit for the plasma display panel.

As shown in FIG. 10, the three-electrode surface-discharge plasma display device of an AC drive type is composed of the display panel 201 and a control circuit 205 which generates control signals for controlling the drive circuit for the plasma display panel by an interface signal which is inputted from the outside. The three-electrode surface-discharge plasma display device of an AC drive type is also composed of an X common driver (an X electrode drive circuit) 206, a scan electrode drive circuit (a scan driver) 203, a Y common driver 204, and an address electrode drive circuit (an address driver) 202, which are to drive panel electrodes by the control signals from the control circuit 205.

The X common driver 206 generates a sustain voltage pulse. The Y common driver 204 also generates a sustain voltage pulse. The scan driver 203 independently drives and scans each of the scan electrodes (Y1 to YL). The address driver 202 applies an address voltage pulse corresponding to display data to each of the address electrodes (A1 to Ad).

The control circuit 205 includes a display data control part 251 which receives a clock CLK and display data DATA and supplies an address control signal to the address driver 202, a scan driver control part 253 which receives a vertical synchronization signal Vsync and a horizontal synchronization signal Hsync and controls the scan driver 203, and a common driver control part 254 which controls the common drivers (the X common driver 206 and the Y common driver 204). The display data control part 251 includes a frame memory 252.

FIG. 11 is a view showing examples of drive waveforms of the plasma display device shown in FIG. 10. It schematically shows waveforms of applied voltages to the respective electrodes, mainly in a total write period (AW), a total erase period (AE), an address period (ADD), and a sustain period (a sustain discharge period: SUS).

In FIG. 11, drive periods directly involved in image display are the address period ADD and the sustain period SUS. A pixel to be displayed is selected in the address period ADD, and the selected pixel is caused to sustain light emission in the next sustain period so that an image is displayed with a predetermined brightness. Note that FIG. 11 shows the drive waveforms in each sub-frame when one frame consists of the plural sub-frames (sub-fields).

First, in the address period ADD, an intermediate potential −Vmy is synchronously applied to all the Y electrodes (Y1 to YL) which are the scan electrodes. Thereafter, the intermediate potential −Vmy is changed over to a scan voltage pulse on a −Vy level, which is applied to the Y electrodes (Y1 to YL) in sequence. At this time, an address voltage pulse on a +Va level is applied to each of the address electrodes (A electrodes: A1 to Ad) in synchronization with the application of the scan voltage pulse to each of the Y electrodes, thereby performing pixel selection on each scan line.

In the subsequent sustain period SUS, a common sustain voltage pulse on a +Vs level is alternately applied to all of the scan electrodes (Y1 to YL) and the X electrodes (X1 to XL), thereby allowing the pixel which is previously selected to sustain the light emission. By this successive application, the display with the predetermined brightness is performed. Further, when the number of times the light emissions are performed by combining a series of the basic operations of the drive waveforms as described above, it is also made possible to display the tone of shading.

Here, the total write period AW is a period in which a write voltage pulse is applied to all the display cells of the panel to activate each of the display cells and keep their display characteristics uniform. The total write period AW is inserted at a regular cycle. The total erase period AE is a period in which an erase voltage pulse is applied to all the display cells of the panel before an address operation and a sustain operation for image display are newly started, thereby erasing previous display contents.

In the plasma display device shown in FIG. 10, the scan driver 203 and the address driver 202 require circuits for the respective electrodes, each of the circuits selectively applying a drive pulse to each of the electrodes. An element having an integrated circuit configuration is usually used for this circuit as its main circuit component.

For example, a 42-inch class PDP has 512 electrodes on a scan electrode side and 3072 electrodes for 1024 pixels (3 lines of RGB for one pixel) on an address electrode side. Drive circuits corresponding to the respective electrodes need to be connected thereto.

In general, 64 circuits are integrated as a driver IC for such drive circuits, each IC being able to drive 64 electrodes. Therefore, in general, 8 driver ICs for the 512 electrodes are used on the scan electrode side and 48 driver ICs for the 3072 electrodes are used on the address electrode side.

In order to thus incorporate a large number of the driver ICs as the drive circuits, sure and highly reliable electrical connection to a large number of the electrodes is basically necessary, and a high-density mounting structure which realizes small and thin mounting of these circuits in a compact manner is also necessary.

In order to achieve the above objects, a method is adopted in which the plural driver ICs are integrated into a module on a substrate and this module is assembled into a device through the use of a mounting technique such as COB (Chip On Board), COM (Chip On Multiple Board), and the like in which bare chip ICs are mounted directly on the substrate.

FIG. 12A, FIG. 12B, FIG. 13A, and FIG. 13B show examples of such a driver IC mounting module.

FIG. 12A is a perspective view of an IC mounting module having the COB structure, and FIG. 12B is a cross sectional view thereof. In this COB structure, driver IC chips 406 each sealed with a resin 402 are mounted on a rigid printed substrate 401. Respective pad terminals for an input power supply, an input signal, and an output which are provided on the surface of the driver IC chip 406 are connected to corresponding terminals on the printed substrate 401 by wire bonding and wires are connected thereto.

Output wires connected to output pads of the IC chip 406 are connected to connection terminals which are drawn out to an end surface side of the printed substrate 401. The connection terminals are connected to a flexible substrate 403 having terminals, each corresponding to each of the connection terminals, by thermocompression to form one module.

At a tip of this flexible substrate 403, an output terminal 404 for connection to panel display electrodes is provided. The output terminal 404 is connected to the panel display electrodes for use by a method such as the thermocompression. A flat flexible cable (FFC) 405 is connected to the printed substrate 401.

FIG. 13A is a perspective view of an IC mounting module having the COM structure, and FIG. 13B is a cross sectional view thereof. In this COM structure, the entire substrate is formed as a composite substrate in which a rigid substrate 401 as a base and a flexible substrate 403 with an output terminal 404 formed thereon are bonded together.

Driver IC chips 406 are mounted on the rigid printed substrate 401 in this composite substrate. Thereafter, pad terminals, which are provided on the surface of each of the driver IC chip 406, for an input power supply and an input signal are connected to corresponding terminals on the printed substrate 401 respectively by wire bonding. Output pads on the surface of the driver IC chip 406 are connected to corresponding terminals of the flexible substrate 403 similarly by wire bonding and wires are connected thereto. Thereafter, the driver IC chip 406 is sealed with a resin 402.

Output wires are formed on this flexible substrate 403. An output terminal 404 is provided at a tip of the output wires and is connected to panel display electrodes for use by a method such as the thermocompression similarly to the above COB structure. A flat flexible cable (FFC) 405 is connected to the printed substrate 401.

In both of the COB structure and the COM structure described above, the resin is applied not only on the IC chip but also on connecting bonding wires and a region around the IC chip on the substrate on which the IC chip is mounted so that the resin covers all of them. This serves as a measure for preventing humidity from entering from a surrounding environment and for preventing destruction by a mechanical force such as contact.

Such a resin applied for a protective purpose is called a sealing resin. An epoxy resin, a silicon resin, or the like is generally used as this resin.

As described above, since the number of usage times of the driver IC for drive circuits is large, module mounting using a bare chip is adopted in order to secure high performance in electrical connection to a large number of the electrodes and to realize a small-size, thin assembly. Further, as is described above, the sealing resin is generally applied on the IC chip and its surrounding area to cover all of them.

In such a conventional structure, if the driver IC should be over-loaded and in addition, kept operated for many hours, heat generated on the IC chip tends to be confined inside the sealing resin. As a result, the conventional structure has such a characteristic that a material of the sealing resin easily reaches a high temperature.

The increase in the temperature of the IC chip and the sealing resin at this time varies depending on the heat release structure of the chip itself, the amount of the sealing resin applied thereon, and the degree of the load given thereto. In some cases, however, the temperature may rise close to the maximum rated temperature (approximately 150° C.).

When the material of this sealing resin is exposed to such a high temperature as described above for a long time, its resin constituent begins to present thermal degradation. As a result, air-tightness and a protective function against a mechanical force which are demanded for the sealing resin are greatly impaired. This results in a disadvantage that it is difficult to secure a long-term reliability of the IC chip.

SUMMARY OF THE INVENTION

It is an object of the present invention to protect a semiconductor bare chip against humidity, a mechanical force, and so on and to enhance a heat release characteristic of the semiconductor bare chip.

According to an aspect of the present invention, provided is a semiconductor chip mounting substrate, comprising a semiconductor bare chip and a substrate electrically connected to the semiconductor bare chip by wire bonding. Here, a protective film is provided on the surface of the semiconductor bare chip, and it is disposed so as to expose all or a part of a bonding wire.

The provision of the protective film on the surface of the semiconductor bare chip makes it possible to prevent humidity from entering the semiconductor bare chip from its surrounding environment and to prevent destruction by a mechanical force such as contact. Further, the protective film is disposed so as to expose all or a part of the bonding wire so that generated heat on the semiconductor bare chip can be released into the air via this bonding wire. This can prevent temperature increase of the protective film and prevent transmutation and quality deterioration of the protective film. Moreover, the prevention of the temperature increase of the semiconductor bare chip makes it possible to secure reliability over a long period.

BRIEF DESCRIPTION OF THE DRAWINGS

FIG. 1A is a cross sectional view of a semiconductor chip mounting substrate according to a first embodiment of the present invention, and FIG. 1B is a perspective view thereof;

FIG. 4 is a cross sectional view of a semiconductor chip mounting substrate according to a fourth embodiment of the present invention;

FIG. 5 is a cross sectional view of a semiconductor chip mounting substrate according to a fifth embodiment of the present invention;

FIG. 6A and FIG. 6B are cross sectional views of semiconductor chip mounting substrates according to a sixth embodiment of the present invention;

FIG. 7A is a perspective view of a semiconductor chip mounting substrate according to a seventh embodiment of the present invention and FIG. 7B is a perspective view of a plasma display using the semiconductor chip mounting substrate;

FIG. 8 is a schematic plan view of a surface discharge AC-type plasma display panel;

FIG. 10 is a block diagram showing a drive circuit for the surface discharge AC-type plasma display panel;

FIG. 11 is a waveform chart showing drive voltage waveforms of the surface discharge AC-type plasma display panel;

DETAILED DESCRIPTION OF THE PREFERRED EMBODIMENTS

First Embodiment

Figure 2:
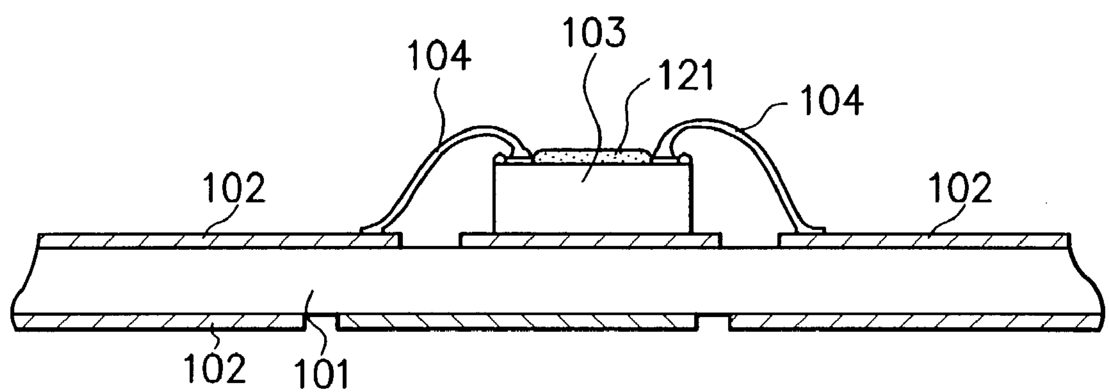
FIG. 2 is a cross sectional view of a semiconductor chip mounting substrate according to a second embodiment of the present invention.

FIG. 1A is a cross sectional view of a semiconductor chip mounting substrate according to a first embodiment of the present invention and FIG. 1B is a perspective view thereof. Wire terminals 102 made of, for example, copper are provided on both surfaces of a rigid printed substrate 101. An IC bare chip 103 is a semiconductor bare chip (for example, a silicon bare chip). The IC bare chip 103 is fixedly die-bonded on the surface of the printed substrate 101 using Ag paste. Bonding pad terminals of the IC bare chip 103 and the terminals 102 of the printed substrate 101 are electrically connected by wire bonding using metal wires 104.

In the above-described structure, a resin protective film 105 is applied on the surface of the IC chip 103 and terminal portions (bonding pad portions) thereof very thinly to be about 0.1 mm to 1 mm in thickness. The protective film 105 is provided on the surface of the IC chip 103 and is disposed so as to expose at least a part of each of the bonding wires 104. The protective film 105 is provided so that an active region on the surface of the IC chip 103 and the connection terminal portions thereof are protected against humidity from a surrounding environment. Further, the protective film 105 is disposed to cover connection portions of the bonding wires 104 on the IC chip 103.

An epoxy resin, a silicon resin, or other arbitrary resins such as a polyimide resin having a humidity protective function is usable as a material of the protective film 105. The protective film 105 is applied in such a manner that the flow rate of the resin is limited using a dispenser and an application region is controlled to be limited.

According to the first embodiment described above, the protective film 105 is applied only very thinly on the surface of the IC chip 103 and the terminal portions thereof. Therefore, heat confinement in the sealing resin film 105 can be prevented. Moreover, generated heat on the IC chip 103 can be efficiently released into the air by the exposed bonding wires 104.

As a result, the heat confinement inside the protective film 105 is prevented, an extreme increase in temperature is prevented, quality deterioration of the material of the protective film 105 is prevented, and the heat generation on the IC chip 103 is reduced. Hence, reliability can be secured over a long period.

Second Embodiment

FIG. 2 is a cross sectional view of a semiconductor chip mounting substrate according to a second embodiment of the present invention. In the second embodiment, compared with the first embodiment, an IC chip 103 on which a protective film 121 is applied in advance is used to protect the surface of the IC chip 103. More specifically, in the first embodiment, the protective film 105 is formed on the IC chip 103 after the wire bonding. In the second embodiment, the protective film 121 is formed on the IC chip 103 before the wire bonding.

The second embodiment will be explained. As the protective film 121, a silicon nitride film is formed on an active region on the surface of the IC chip 103 to have a relatively large thickness (~10 μm). This allows the protective film 121 to have a sufficient humidity protective function. Degradation in connection performance of pad terminal portions on the IC chip 103 is prevented by sufficient control of the conditions at the time of the wire bonding. Therefore, the protection by the protective film (resin) is unnecessary.

As a modified example of this embodiment, a polyimide resin may be thinly applied as the protective film 121 on the active region on the surface of the IC chip 103. In this case, the silicon nitride film has a usual thickness of about 1 μm, and on this silicon nitride film, the polyimide resin is applied on a region except the bonding pad terminal portions of the IC chip 103 to be about ten-odd μm.

Also in the second embodiment described above, heat confinement inside the protective film 121 can be protected, temperature increase can be suppressed, and quality deterioration of a material of the protective film 121 and heat generation on the IC chip 103 can be prevented. In addition, the method of applying only the relatively thick silicon nitride film eliminates a protective resin applying process and enables cost reduction.

As described in the above first and second embodiments, the protective film 105 or 121 is provided on the surface of the IC chip 103 and is disposed so as to expose a part or all of each of the bonding wires 104. In the first embodiment, the protective film 105 is disposed to cover the connection portions of the bonding wires 104 on the IC chip 103. In the second embodiment, the protective film 121 is disposed to expose connection portions of the bonding wires 104 on the IC chip 103.

Third Embodiment

Figure 3:
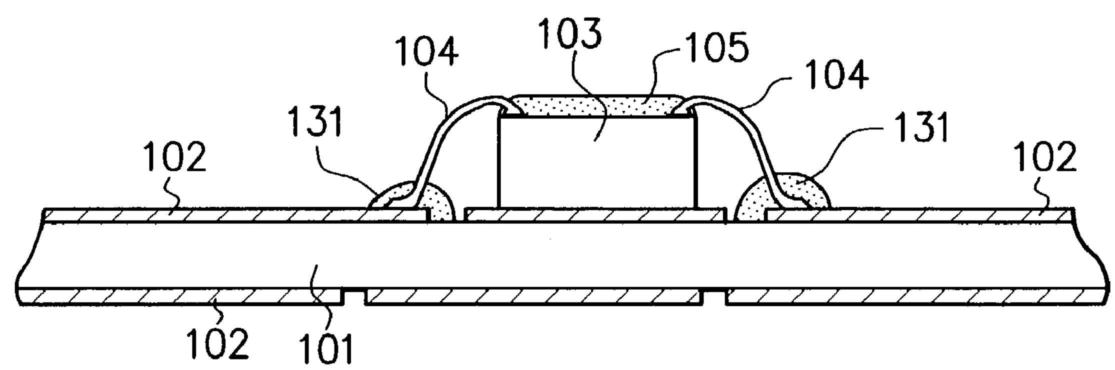
FIG. 3 is a cross sectional view of a semiconductor chip mounting substrate according to a third embodiment of the present invention.
Figure 9:
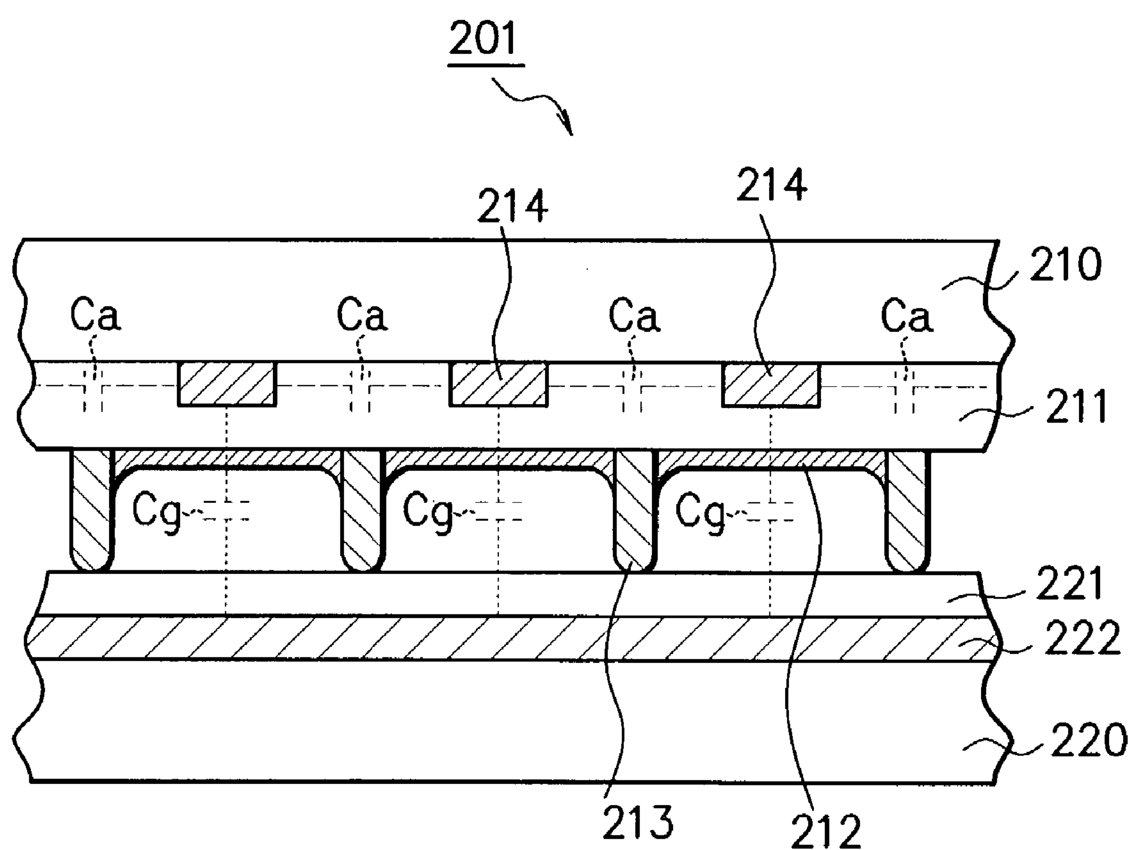
FIG. 9 is a schematic cross sectional view of the surface discharge AC-type plasma display panel.
Figure 12A:
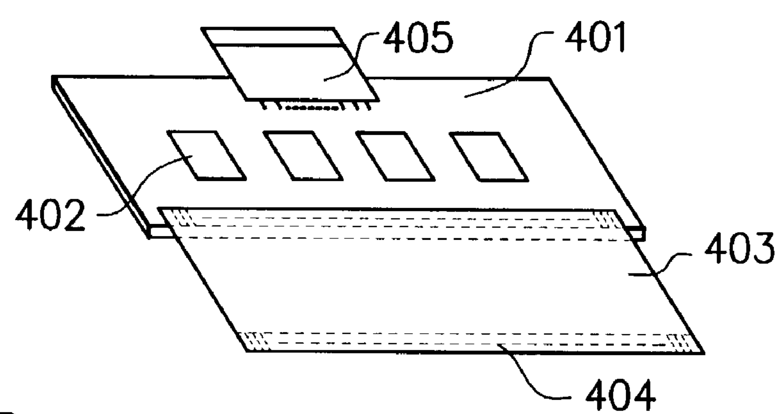
FIG. 12A is a perspective view of a semiconductor chip mounting substrate (COB structure) according to a conventional art and FIG. 12B is a cross sectional view thereof.
Figure 12B:
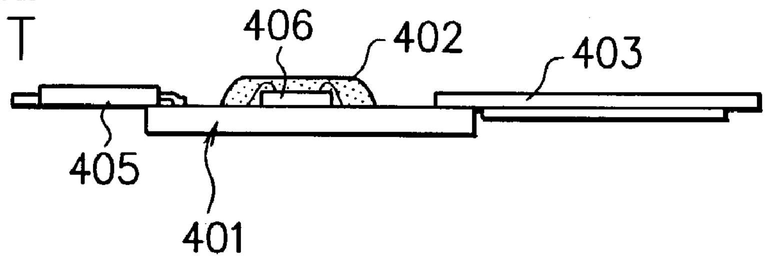
Figure 13A:
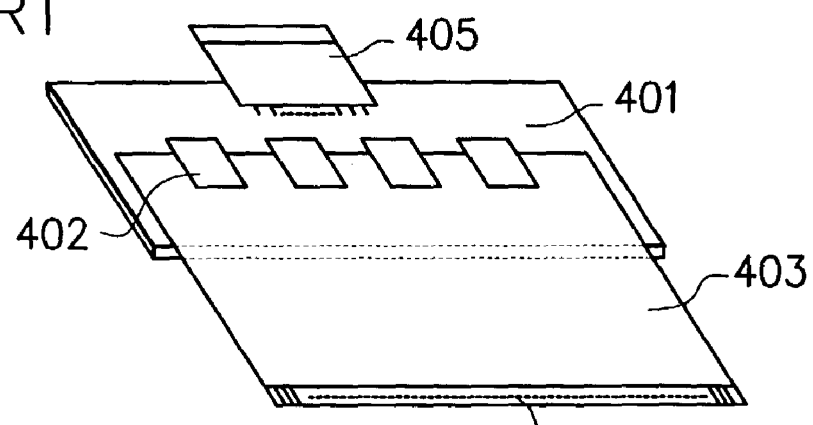
FIG. 13A is a perspective view of a semiconductor chip mounting substrate (COM structure) according to a conventional art and FIG. 13B is a cross sectional view thereof.
Figure 13B:
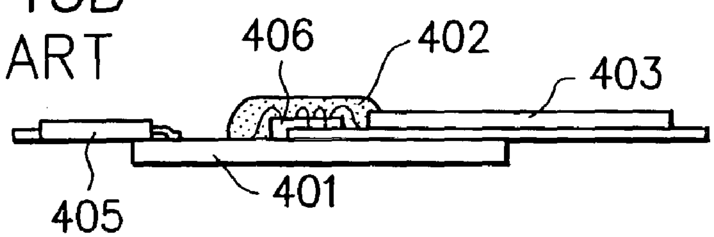

FIG. 3 is a cross sectional view of a semiconductor chip mounting substrate according to a third embodiment of the present invention. Points in which this embodiment is different from the first embodiment will be explained. In this embodiment, bonding portions of bonding wires 104 on a printed substrate 101, besides bonding portions (connection portions) of the bonding wires 104 on an IC chip 103, are applied with protective films (resin) 131. After a bonding connection process is finished, a protective film (resin) 105 is applied on the surface of the IC chip 103 and the protective films (resin) 131 are applied on the bonding portions on the printed substrate 101.

As described above, the protective films 131 can be provided on the connection portions of the bonding wires 104 on the printed substrate 101 (including wire terminals 102). This is advantageous in that the conditions such as temperature and pressure at the time of bonding can be set in a relatively wide range so that process control can be simplified. This is also advantageous in that connection strength of the wires 104 is increased so that reliability including an insulation property can be sufficiently secured even in an environment at high temperature and high humidity.

Fourth Embodiment

FIG. 4 is a cross sectional view of a semiconductor chip mounting substrate according to a fourth embodiment of the present invention. In the first to third embodiments described above, the COB structure is adopted. In the fourth embodiment, the COM structure is adopted, and as a substrate structure, used is a composite substrate structure in which a flexible substrate 141 is bonded onto a printed substrate 101. Wire terminals 142 are formed on the surface of the flexible substrate 141. The flexible substrate 141 is flexible compared with the printed substrate 101. A hard substrate is used as the printed substrate 101 in order to mechanically protect an IC chip 103. A substrate which can be folded is used as the flexible substrate 141 in order to enable wiring such as a flat cable. Detailed explanation thereof will follow with reference to FIG. 7A and FIG. 7B.

The IC chip 103 is fixedly die-bonded onto the surface of the printed substrate 101 using Ag paste. Bonding pads on the IC chip 103 are electrically connected to wire terminals 102 of the printed substrate 101 by metal wires 104*a*. These Bonding pads are also electrically connected to the wire terminals 142 of the flexible substrate 141 by metal wires 104*b*.

In this case, a protective film (resin) 105 is also thinly applied on the surface of the IC chip 103. The protective film 105 covers an active region on the surface of the IC chip 103 and bonding portions of the wires 104*a*, 104*b* for protection. According to this embodiment, sufficient reliability can also be secured in the COM structure.

Fifth Embodiment

FIG. 5 is a cross sectional view of a semiconductor chip mounting substrate according to a fifth embodiment of the present invention. In this embodiment, two IC chips 103*a*, 103*b* and a multilayer ceramic capacitor (chip capacitor) 151 are mounted on a printed substrate 101. A plurality of bonding pads on the IC chip 103*a* are bonded to wire terminals 102 of the printed substrate 101 via a plurality of wires 104. Bonding pads on the IC chip 103*b* are electrically connected to the wire terminals 102 of the printed substrate 101 via metal wires 104*a*, and electrically connected to wire terminals 142 of a flexible substrate 141 by metal wires 104*b*. A capacitor 151 is connected to the wire terminals 102 of the printed substrate 101.

A protective film (resin) 105 is applied on the surfaces of the IC chips 103*a*, 103*b* similarly to the first and fourth embodiments. Hence, reliability can be secured.

Sixth Embodiment

FIG. 6A and FIG. 6B are cross sectional views of semiconductor chip mounting substrates according to a sixth embodiment of the present invention. In this embodiment, protective covers 161, 162 or a protective cover 163 are (is) added to the fifth embodiment (FIG. 5). In FIG. 6A, the protective covers 161 and 162 are provided on an IC chip 103*a* and 103*b* respectively. In FIG. 6B, the common protective cover 163 is provided on a plurality of IC chips 103*a* and 103*b*.

The protective covers 161 to 163 cover the IC chips 103*a*, 103*b*, bonding wires 104, 104*a*, 104*b*, and bonding portions thereof for protection. Each of protective covers 161 to 163 is fixed on a printed substrate 101 (including wire terminals 102) and/or a flexible substrate 141 (including wire terminals 142) by an adhesive or a mechanical fixing method (screwing, hooking, or the like).

The protective covers 161 to 163 are made of, for example, resin or metal. The protective covers 161 to 163 are preferably made of metal in order to obtain a good heat release property of the protective covers 161 to 163. In the case when the protective covers 161 to 163 are made of metal, insulation films need to be provided in connection portions between the protective covers 161 to 163 and the wire terminals 102. The protective covers 161 to 163 are preferably made of resin in order to obtain a good electrical insulation property.

The protective covers 161 to 163 described above have a hollow portion and are provided on the printed substrate 101 to cover at least areas above the IC chips 103*a*, 103*b* and the bonding wires 104, 104*a*, 104*b*. In other words, the protective covers 161 to 163 may surround all of upper surfaces and side surfaces of the IC chips 103*a*, 103*b*, and so on to cover them. Alternatively, each of them may have a hole on either one of the side surfaces thereof. If the hole is made, it serves as a ventilation hole, thereby enhancing the heat release property.

The protective covers 161 to 163 work as mechanical protection when the printed substrate 101 is manually handled at the time of electrical inspection, packing, transportation, and so on after the IC chips 103*a*, 103*b* are mounted on the printed substrate 101. Moreover, reliability can be secured over a long period even in an environment having a large amount of dust and so on when this semiconductor chip mounting substrate is assembled into a display device or the like for use.

Seventh Embodiment

FIG. 7A is a perspective view of a semiconductor chip mounting substrate according to a seventh embodiment of the present invention. In this embodiment, a configuration example in which the semiconductor chip mounting substrate of the sixth embodiment (FIG. 6B) is applied to the scan driver 203 (FIG. 10) of a 42-inch color plasma display panel (PDP). Explanation on a plasma display device here is the same as the contents in FIG. 8 to FIG. 11 and in the previous explanation with reference to these drawings. Two scan driver modules 203*a*, 203*b* correspond to the scan driver 203 in FIG. 10. Each of them has the same structure as that of the semiconductor chip mounting substrate in FIG. 6B. Further, an input connector 312 through which signals from the Y common driver 204 (FIG. 10) and so on are inputted is connected to each of the printed substrates 101. An output terminal 311 from which a signal is outputted to the PDP 201 (FIG. 10) is provided in each of the flexible substrates 141.

The scan driver module is formed of the two mounting substrates 203*a,* 203*b* and is based on the aforesaid COM structure. Each of the scan driver modules 203*a,* 203*b* has four IC chips mounted thereon. Each of the IC chips is applied with the protective film (resin) 105 shown in FIG. 6B and a protective measure is taken by the protective cover 163.

In each of the scan driver modules 203*a*, 203*b,* a plurality of signals and a power supply are inputted to input portions thereof via the input connector 312, and 64 output lines of each of the IC chips are extended to the output terminal 311 via an electrode 142 (FIG. 6B) on the flexible substrate 141, the output lines being totally 256 in number. At a tip of the flexible substrate 141, the output terminal 311 for connection to a terminal side of the PDP 201 (FIG. 10) by thermocompression is provided.

FIG. 7B shows a configuration example in which the scan driver modules 203*a*, 203*b* in FIG. 7A are assembled in the 42-inch color plasma display device. This plasma display device corresponds to FIG. 10. It includes a power supply substrate 301, an address bus substrate 302, and X bus substrates 303*a*, 303*b,* in addition to the scan drivers 203*a*, 203*b,* the Y common driver 204, the control circuit 205, the X common driver 206, and the address driver 202. The power supply substrate 301 has a power supply circuit and supplies power. The address bus substrate 302 is connected between the control circuit 205 and the address driver 202. The X bus substrates 303*a,* 303*b* are connected between the X common driver 206 and the PDP 201.

The output terminals 311 (FIG. 7A) of the scan driver modules 203*a*, 203*b* are connected to a left scan terminal portion on the rear surface of the PDP 201 (FIG. 10) by thermocompression. The input connectors 312 (FIG. 7A) thereof are connected to the Y common driver 204. The scan driver modules 203*a,* 203*b*, the X bus substrates 303*a*, 303*b,* and the address driver 202 are connected to the PDP 201, wrapping around the PDP 201 to the rear surface thereof. As described above, the use of the flexible substrates 141 enables the scan driver modules 203*a,* 203*b* and so on to wrap around the PDP 201 to the rear surface thereof by folding the flexible substrates 141.

The conventional semiconductor chip mounting substrates (FIG. 12A, FIG. 12B, and FIG. 13A, FIG. 13B) are so structured that the sealing resin covers not only the IC chip but also the bonding wires and their vicinity on the mounting substrate. In the first to seventh embodiments, however, the protective film (resin) is applied on areas limited to only the surface of the IC chip and/or the wire connection portions. The reduction in the resin amount can reduce the heat confinement inside the material of the sealing resin. Further, the exposure of the bonding wires into the air facilitates the release of the generated heat on the IC chips into the air via these wires. This prevents the temperature increase inside the material of the sealing resin, the transmutation and quality deterioration of the resin material, and the temperature increase of the IC chip. Hence, the structure able to secure reliability over a long period can be realized.

Especially, the present invention is suitable as the structure of an IC chip mounting substrate in driving a flat display panel consuming a relatively high power such as a plasma display panel (PDP). The present invention enables a high density mounting of IC chips and can provide a mounting structure with high quality stability and high reliability. Further, a mounting structure with high quality and high reliability can be provided by devising a sealing method of a sealing resin portion for protecting the IC chip itself.

The semiconductor chip mounting substrate described above is preferably used in a flat display, and more preferably, in a plasma display. It is also applicable to other displays. The flat display may be a plasma display, an electroluminiscence display, a liquid crystal display (LCD), and the like. In this case, it is suitable that the flat display panel is used instead of the aforesaid plasma display panel.

As described above, the protective film is provided on the surface of the semiconductor bare chip so that humidity can be prevented from entering the semiconductor bare chip from the surrounding environment and the destruction by the mechanical force such as contact can be prevented. Further, the protective film is provided so as to expose all or a part of each of the bonding wires so that the generated heat on the semiconductor bare chip can be released into the air via the bonding wires. This prevents the temperature increase of the protective film, the transmutation and quality deterioration of the protective film, and the temperature increase of the semiconductor bare chip. As a result, reliability can be secured over a long period.

The present embodiments are to be considered in all respects as illustrative and no restrictive, and all changes which come within the meaning and range of equivalency of the claims are therefore intended to be embraced therein. The invention may be embodied in other specific forms without departing from the sprit or essential characteristics thereof.

What is claimed is:

1. A semiconductor chip mounting substrate, comprising:

a semiconductor bare chip;

a substrate electrically connected to said semiconductor bare chip by a bonding wire which connects to a connection terminal on the semiconductor bare chip at a connection region of the bonding wire; and a first protective film provided to cover only a surface of said semiconductor bare chip and the connection region of the bonding wire so as to expose the bonding wire except the connection region thereof, wherein the first protective film is not in contact with any protective cover.

2. The semiconductor chip mounting substrate according to claim 1, further comprising:

a second protective film provided on the connection terminal portion of the bonding wire on said substrate.

3. The semiconductor chip mounting substrate according to claim 1, wherein said first protective film is a resin.

4. The semiconductor chip mounting substrate according to claim 1, wherein said first protective film is a silicon nitride film.

5. The semiconductor chip mounting substrate according to claim 1, wherein said first protective film is formed on the surface of said semiconductor bare chip after the bonding of the bonding wire or before the bonding of the bonding wire.

6. A semiconductor chip mounting substrate, comprising:

a semiconductor bare chip;

a substrate electrically connected to said semiconductor bare chip by a bonding wire which connects to a connection terminal on the semiconductor bare chip at a connection region of the bonding wire; and a first protective film provided on a surface of said semiconductor bare chip so as to expose all of a bonding wire except the connection region of the bonding wire on said semiconductor bare chip, wherein the first protective film is not in contact with any protective cover.

7. A flat display, comprising:

a flat display panel; and a semiconductor chip mounting substrate connected to said flat display panel, wherein said semiconductor chip mounting substrate comprises a semiconductor bare chip, a substrate electrically connected to said semiconductor bare chip by a bonding wire which connects to a connection terminal on the semiconductor bare chip at a connection region of the bonding wire, and a first protective film provided on a surface of said semiconductor bare chip so as to expose all of the bonding wire except the connection region of the bonding wire on said semiconductor bare chip, wherein the first protective film is not in contact with any protective cover.

8. The semiconductor chip mounting substrate according to claim 1, wherein said substrate is a printed substrate or a flexible substrate.

9. The semiconductor chip mounting substrate according to claim 8, wherein said semiconductor bare chip is electrically connected to said printed substrate and said flexible substrate by a bonding wire having the connection region connecting the bonding wire via the connection terminal portion to the terminal of the semiconductor bare chip.

10. The semiconductor chip mounting substrate according to claim 1, further comprising:

the protective cover having a hollow portion and provided on said substrate to cover at least an area above said semiconductor bare chip and the bonding wire.

11. The semiconductor chip mounting substrate according to claim 10, wherein the protective cover is fixed to said substrate by adhesive.

12. The semiconductor chip mounting substrate according to claim 10, wherein a plurality of said semiconductor bare chips are provided on said substrate, wherein the protective cover is disposed on said substrate to cover at least an area above one or a plurality of said semiconductor bare chips and the bonding wire.

13. The semiconductor chip mounting substrate according to claim 1, wherein a plurality of said semiconductor bare chips are provided on said substrate.

14. A flat display, comprising:

a flat display panel; and a semiconductor chip mounting substrate connected to said flat display panel, wherein said semiconductor chip mounting substrate comprises a semiconductor bare chip, a substrate electrically connected to said semiconductor bare chip by a bonding wire which connects to a connection terminal on the semiconductor bare chip at a connection region of the bonding wire, and a first protective film provided to cover only a surface of said semiconductor bare chip and the connection region of the bonding wire so as to expose the bonding wire except the connection region thereof, wherein the first protective film is not in contact with any protective cover.

15. A semiconductor chip mounting substrate, comprising:

a semiconductor bare chip;

a flexible substrate electrically connected to said semiconductor bare chip by a bonding wire which connects to a connection terminal on the semiconductor bare chip at a connection region of the bonding wire; and a first protective film provided on a surface of said semiconductor bare chip and disposed so as to expose all or a part of the bonding wire, wherein the first protective film is not in contact with any protective cover.

16. The semiconductor ship mounting substrate according to claim 15, wherein said semiconductor bare chip is electrically connected to said flexible substrate and a printed substrate by the bonding wire having the connection region connecting the bonding wire via the connection terminal portion to the terminal of the semiconductor bare chip.

17. A flat display, comprising:

a flat display panel; and a semiconductor chip mounting substrate connected to said flat display panel, wherein said semiconductor chip mounting substrate comprises a semiconductor bare chip, a flexible substrate electrically connected to said semiconductor bare chip by a bonding wire which connects to a connection terminal on the semiconductor bare chip at a connection region of the bonding wire, and a first protective film provided on a surface of said semiconductor bare chip and disposed so as to expose all or a part of the bonding wire, wherein the first protective film is not in contact with any protective cover.

18. A semiconductor chip mounting substrate, comprising:

a semiconductor bare chip;

a substrate electrically connected to said semiconductor bare chip by a bonding wire which connects to a connection terminal on the semiconductor bare chip at a connection region of the bonding wire;

a first protective film provided on a surface of said semiconductor bare chip and disposed so as to expose all or a part of the bonding wire, wherein the first protective film is not in contact with any protective cover;

the protective cover provided on said substrate to cover at least an area above said semiconductor bare chip and the bonding wire; and a hollow portion between said first protective film and the protective cover.

19. The semiconductor chip mounting substrate according to claim 18, wherein the protective cover is fixed to said substrate by adhesive.

20. The semiconductor chip mounting substrate according to claim 18, wherein a plurality of said semiconductor bare chips are provided on said substrate, and wherein the protective cover is disposed on said substrate to cover at least an area above one or a plurality of said semiconductor bare chips and the bonding wire.

21. A flat display, comprising:

a flat display panel; and a semiconductor chip mounting substrate connected to said flat display panel, wherein said semiconductor chip mounting substrate comprises a semiconductor bare chip, a substrate electrically connected to said semiconductor bare chip by a bonding wire which connects to a connection terminal on the semiconductor bare chip at a connection region of the bonding wire, a first protective film provided on a surface of said semiconductor bare chip and disposed so as to expose all or a part of the bonding wire, wherein the first protective film is not in contact with any protective cover, the protective cover provided on said substrate to cover at least an area above said semiconductor bare chip and the bonding wire, and a hollow portion between said first protective film and the protective cover.

22. A semiconductor chip mounting substrate, comprising:

a semiconductor bare chip;

a substrate electrically connected to said semiconductor bare chip by a bonding wire;

a first protective film provided to cover a surface of said semiconductor bare chip and a first connection terminal portion of the bonding wire so as to expose a part of the bonding wire;

a second protective film provided on a second connection terminal portion of the bonding wire on said substrate; and a protective cover having a hollow portion and provided on said substrate to cover said semiconductor bare chip, the bonding wire and the second connection terminal portion.

* * * * *